United States Patent [19]
Kusaka et al.

[11] Patent Number: 5,753,977
[45] Date of Patent: May 19, 1998

[54] SEMICONDUCTOR DEVICE AND LEAD FRAME THEREFOR

[75] Inventors: Kenichi Kusaka; Yoshiharu Takahashi, both of Tokyo, Japan

[73] Assignee: Mitsubishi Denki Kabushiki Kaisha, Tokyo, Japan

[21] Appl. No.: 768,909

[22] Filed: Dec. 18, 1996

[30] Foreign Application Priority Data

Mar. 22, 1996 [JP] Japan ................ 8-066220

[51] Int. Cl.$^6$ ............... H01L 23/495; H01L 23/28; H01L 23/29
[52] U.S. Cl. .............. 257/787; 257/666; 257/674; 257/793; 438/127
[58] Field of Search ................. 257/787, 666, 257/674, 773, 786, 796, 793; 437/220; 438/26, 55, 64, 15, 123, 124, 126, 127

[56] References Cited

U.S. PATENT DOCUMENTS

| | | |
|---|---|---|
| 5,021,865 | 6/1991 | Takahashi et al. ............ 257/676 |
| 5,569,964 | 10/1996 | Ikebe ........................ 257/786 |

FOREIGN PATENT DOCUMENTS

| | | | |
|---|---|---|---|
| 0320997 | 6/1989 | European Pat. Off. ........ 257/666 |
| 55-24479 | 2/1980 | Japan ........................ 257/786 |
| 1014942 | 1/1989 | Japan ........................ 257/796 |
| 6469041 | 3/1989 | Japan . | |
| 228966 | 1/1990 | Japan . | |
| 3280560 | 12/1991 | Japan ........................ 257/796 |

*Primary Examiner*—Mahshid D. Saadat
*Assistant Examiner*—Jhihan B. Clark
*Attorney, Agent, or Firm*—Leydig, Voit & Mayer, Ltd.

[57] ABSTRACT

A semiconductor device includes a semiconductor chip; leads including first inner leads and second inner leads extending substantially radially from a central point of the semiconductor chip; electrical conductors electrically connecting the semiconductor chip to the lead frame; and an encapsulating resin encapsulating the semiconductor chip, the electrical conductors, and the inner leads. Each of the first inner leads has a first inner end located proximate the central point and each of the second inner leads has a second inner end located farther from the central point than the first inner ends. The first and second inner leads are alternatingly arranged. Thus, at least some of the inner leads extend under the semiconductor chip, providing heat conducting paths. The lead frame includes a frame and leads supported by the frame and including first inner leads and second inner leads extending substantially radially toward a central point of the frame. The lead frame is applicable for mounting semiconductor chips of different outer dimensions and a necessary clearance is maintained between the leads.

3 Claims, 17 Drawing Sheets

SEMICONDUCTOR DEVICE AND LEAD FRAME THEREFOR

BACKGROUND OF THE INVENTION

This invention relates to a resin encapsulated semiconductor device and a lead frame for a resin encapsulated semiconductor device which allows semiconductor chips of various sizes to be mounted on a common lead frame without the need for significantly changing the assembly technique and which improves heat dissipation.

FIG. 15a is a schematic plan view showing a conventional semiconductor device, FIG. 15b is a sectional view taken along line 15b—15b of FIG. 15a, FIG. 16 is a plan view of a lead frame having 100 pins for use in a conventional semiconductor device and FIG. 17 is a fragmentary view of FIG. 16. In FIGS. 15a to 17, the reference numeral 1 is a semiconductor chip, 2 is a die pad, 3 is a bonding agent, 4 are inner leads, 5 are metal wires and 6 is molded resin. As shown in these figures, in the conventional semiconductor device and the lead frame used therefor, the die pad 2 has dimensions corresponding to the size of the semiconductor chip 1, so that the lead frame is prepared for the respective semiconductor chip 1 used. In other words, in the conventional resin encapsulated semiconductor device, many lead frames must be prepared for semiconductor chips of various different sizes on a one-to-one correspondence basis.

Thus, in the conventional technique, the number of kinds of lead frames that must be prepared for manufacturing the semiconductor devices must be equal to the number of kinds of semiconductor chips. Therefore, a lead frame must be manufactured by the expensive etching method and the inexpensive punching method cannot be used, resulting in an increase in the manufacturing cost.

Also, while it is conceivable to arrange the lead frame in a long-loop configuration in order to use one kind of lead frame in common with a plurality of kinds of semiconductor chips of different sizes, this is difficult to satisfactorily achieve at present time in view of the wire bonding technique and the molding technique. Further, with the conventional device, in order to improve heat dissipation, it has often been necessary to include a heat spreader or the like, also resulting in an increase in the cost because the heat generated in the semiconductor chip must be conducted through a relatively thick layer or section of the encapsulating resin which has a poor thermal conductivity.

Thus, in the conventional technique, one kind of lead frame could be used to mount only one kind of the semiconductor chip of the same size. Therefore, since the size of the semiconductor chip differs from one chip to another according to the function of the semiconductor chip, the lead frame is designed for each particular semiconductor chip and substantially only for that chip. Therefore, the lead frame has been produced only through the expensive etching method and it has not been possible to decrease the price of the semiconductor device.

Japanese Patent Laid-Open No. 2-28966 discloses one example of a conventional technique for making a lead frame common to various kinds of semiconductor chips in which a conventional die pad is omitted and the semiconductor chip is bonded by a bonding agent to the inner leads of the lead frame with a short distance between the chip and the leads to provide a support for the semiconductor chip during the manufacture. However, since the limitation of lead frame manufacturing by punching is not taken into consideration with this proposed technique, the range in which the lead frame can be commonly used is narrow and limited and the range of practical application is limited. In other words, the technique disclosed in Japanese Patent Laid-Open No. 2-28966 is disadvantageous in that, when the number of pins to be wire-bonded to the semiconductor chip is large and the bonding pads are as small as 150 μm to 100 μm and when the semiconductor chip is small, the inner tips of the leads are too crowded to be properly arranged around the semiconductor chip, and it may not be possible to dispose the tips of the leads inside of the contour of the semiconductor chip and to directly bond the inner leads to the semiconductor chip.

SUMMARY OF THE INVENTION

Accordingly, one object of the present invention is to provide a semiconductor device free from the above discussed disadvantages of the conventional device.

Another object of the present invention is to provide a lead frame for a semiconductor device free from the above discussed disadvantages of the conventional lead frame.

Another object of the present invention is to provide a semiconductor device in which any semiconductor chip of various different shapes and sizes may be mounted on the same, common lead frame without the need for substantial change in the assembly technique and in which heat dissipation is improved.

A further object of the present invention is to provide a lead frame which can be commonly used for mounting semiconductor chips of wide varieties of size and is particularly useful for the manufacture of the semiconductor device and capable of manufacturing by the punching process which is less expensive than the etching process.

With the above objects in view, the present invention resides in a semiconductor device comprising a semiconductor device comprising a semiconductor chip, a plurality of leads including first inner leads and second inner leads substantially radially extending from a central point of the semiconductor chip, electrical conductors electrically connecting the semiconductor chip to the inner lead and an encapsulating resin for encapsulating the semiconductor chip, the electrical conductors and the inner leads. Each of the first inner leads has a first inner end located in the vicinity of the central point, and each of the second inner leads has a second inner end located remoter than the first inner end from the central point; and the first and second inner leads are substantially alternatively arranged. Thus, the arrangement is such that at least some of the inner leads extend under the semiconductor chip providing heat conducting paths.

The semiconductor chip may be in an overlapping relationship only with the first inner leads or the semiconductor chip may be in an overlapping relationship only with the first and second inner leads.

The inner leads may include third inner leads each having a third inner end located remoter than the second inner end from the central point, and the semiconductor chip is in an overlapping relationship with respect to the first, second and third inner leads.

The semiconductor device may further comprise an electrically insulating, good thermal conductor disposed between the semiconductor chip and the inner leads. The semiconductor device may further comprise a heat spreader disposed within the encapsulating resin.

The lead frame of the present invention comprises a frame, and a plurality of leads supported by the frame and including first inner leads and second inner leads radially extending substantially toward a central point of the frame. Each of the first inner leads has a first inner end located in the vicinity of the central point, each of the second inner leads has a second inner end located remoter than the first inner end from the central point, and the first and second inner leads are substantially alternatively disposed, whereby the lead frame is made applicable in common to mount thereon semiconductor chips of different outer dimensions and a necessary clearance is maintained between the leads.

The leads may comprise third inner leads each having a third inner end located remoter than the second inner end from the central point.

The second inner leads each may be disposed between the first inner leads and the third inner leads each is disposed between the first and second inner leads.

The lead frame may further comprises a die pad disposed within the frame and inner side of the first inner ends and a support pin connected between the frame and the die pad for supporting the die pad. The die pad may be disposed above a plane including the inner leads.

At least one of the inner leads may be removed for allowing smooth flow of molten encapsulating resin.

The inner leads may be bent in crank-shape to provide inner sections of the inner leads in a plane parallel but different form the plane including the frame.

BRIEF DESCRIPTION OF THE DRAWINGS

The present invention will become more readily apparent from the following detailed description of the preferred embodiments of the present invention taken in conjunction with the accompanying drawings, in which:

FIG. 1b is a sectional side view taken along line 1b—1b of FIG. 1a;

FIG. 3b is a sectional side view taken along line 3b—3b of FIG. 3a;

FIG. 4b is a sectional side view taken along line 4b—4b of FIG. 7a of FIG. 3a;

FIG. 15b is a sectional side view taken along line 15b—15b of FIG. 15a;

DESCRIPTION OF THE PREFERRED EMBODIMENTS

First Embodiment

Figure 1A:
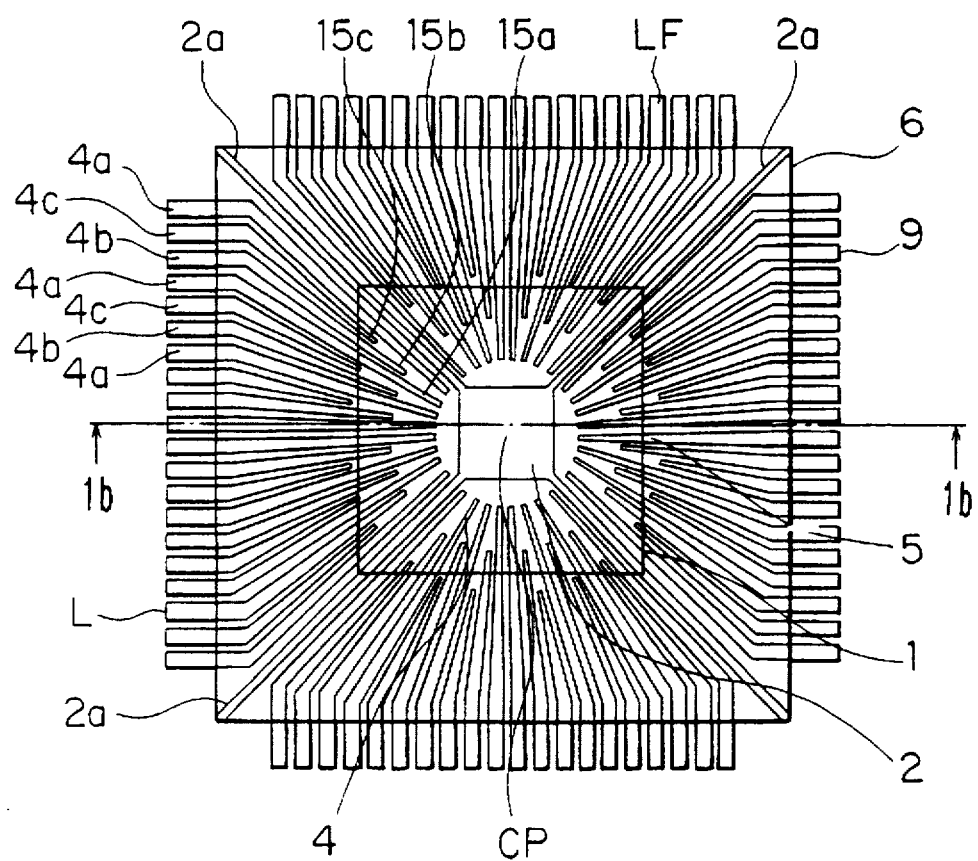
FIG. 1a is a schematic plan view of the semiconductor device of the first embodiment of the present invention.
Figure 1B:
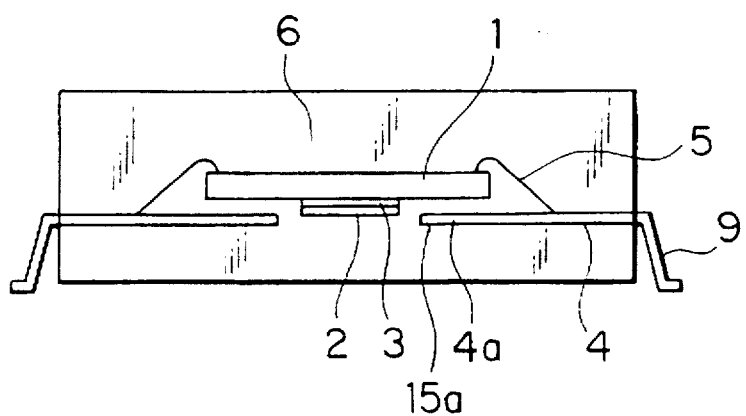

As seen from FIGS. 1a and 1b as well as FIGS. 2a to 2f, the semiconductor device of the present invention comprises a semiconductor chip 1 mounted on a lead frame LF having a plurality of leads L. The leads L include inner leads 4 and outer leads 9 and the inner leads 4 include first inner leads 4a, second inner leads 4b and third inner leads 4c each substantially radially extending from a central point CP of the frame F (see FIG. 5). The lead frame LF also comprises a centrally disposed square die pad 2 having support pins 2a. The semiconductor device also comprises electrical conductors 5 such as bonding wires electrically connecting the semiconductor chip 1 to the inner leads 4 and an encapsulating resin 6 for encapsulating the semiconductor chip 1, the electrical conductors 5 and the inner leads 4.

Each of the first inner leads 4a has a first inner end 15a located in the vicinity of the central point CP of the lead frame LF or the semiconductor chip 1. Each of the second inner leads 4b has a second inner end 15b located further than the first inner end 15a from the central point CP and each of the third inner leads 4c has a third inner end 15c still further from the central point CP. It is seen that the first, the second and the third inner leads are substantially alternatively arranged so that a necessary clearance is maintained between the respective inner leads 4.

The semiconductor chip 1 illustrated in FIGS. 1a and 1b may be of a first size and the die pad 2 is made as small in size as possible as compared to the semiconductor chip 1 and may have a side of 2 mm to 3 mm so that the inner ends of the inner leads 4 may be positioned below the semiconductor chip 1. As best seen from FIG. 1b, the die pad 2 is positioned in a plane above the plane of the inner leads 4 by a distance of the order of 100 μm in order not to place them in the same plane.

In this embodiment, the small die pad 2 is square in shape and the inner leads 4 includes the first inner leads 4a having inner ends 15a located close to and surrounding the die pad 2. It is seen that the inner ends 15a is arranged along a loop or a circle having its center coincident with the center of the die pad 2. The inner leads 4 also includes the second inner leads 4b positioned between the first inner leads 4a and have their inner ends 15a located along a larger loop concentric with the first loop. The inner leads 4 further include the third inner leads 4c positioned between the first inner lead 15a and the second inner lead 15b and having their inner ends 15c located remote from the die pad 2 and concentrically surrounding the second loop.

Figure 2A:
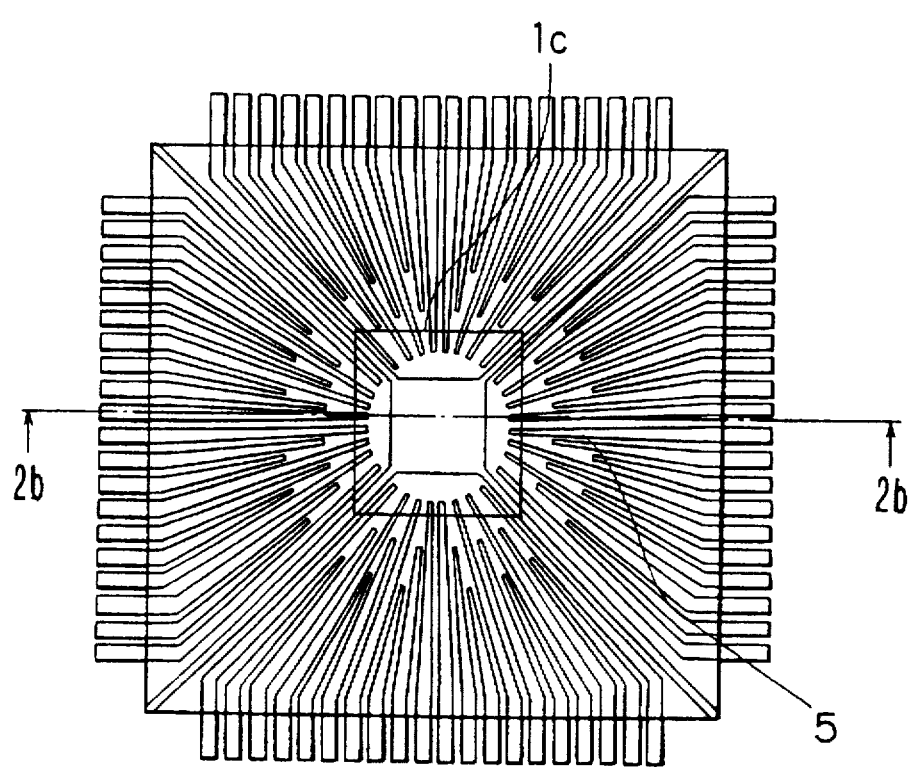
FIGS. 2a to 2c are schematic plan views of various modification of the semi conductor device of the first embodiment of the present invention.
Figure 2B:
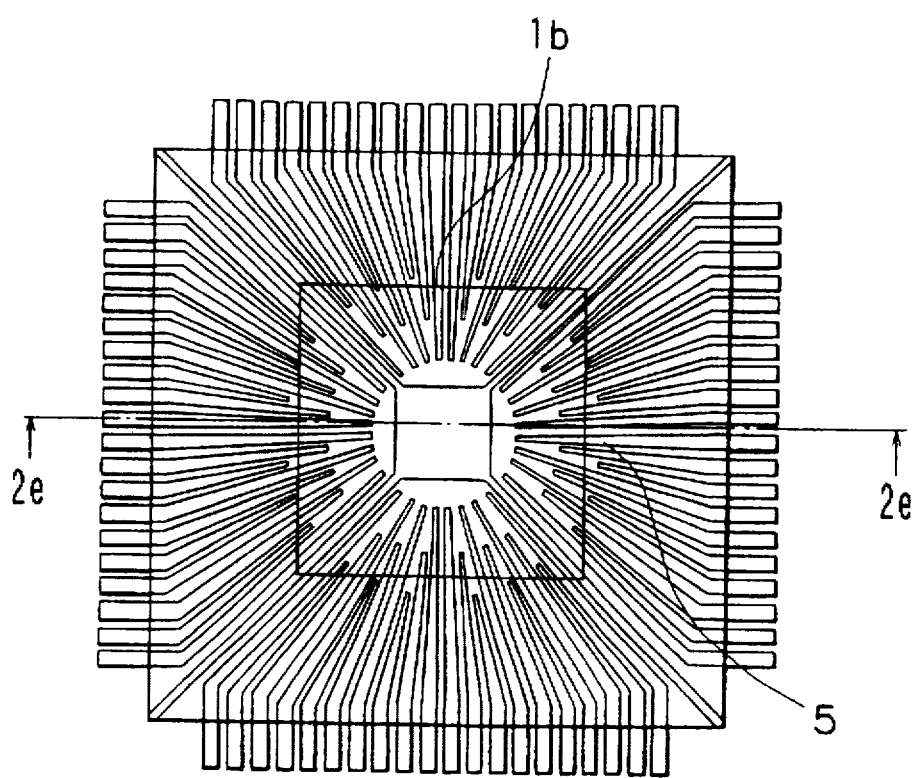
Figure 2C:
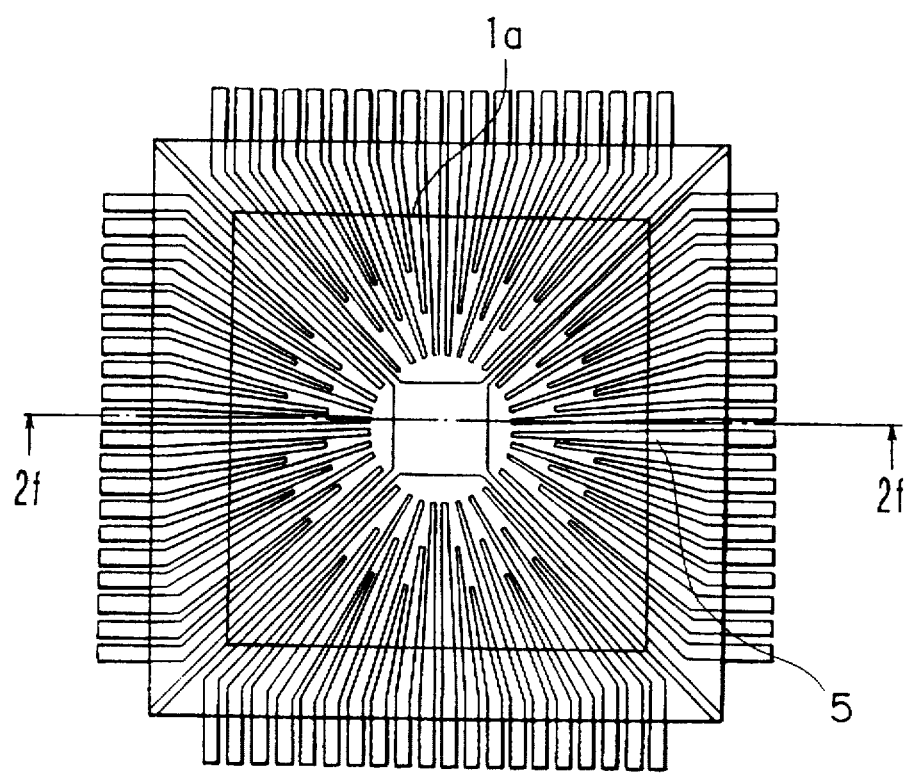
Figure 2D:
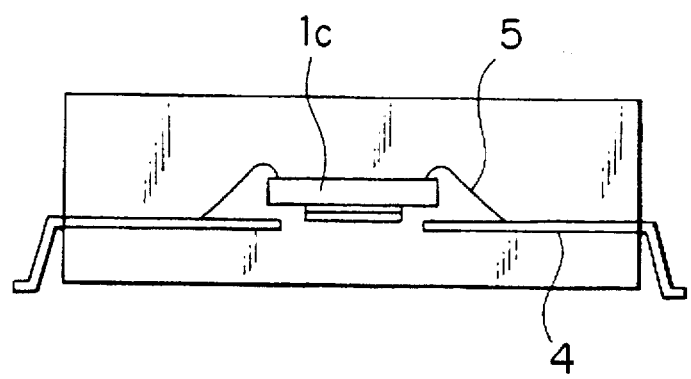
FIGS. 2d to 2f are sectional side views taken along lines 2d—2d, 2e—2e, and 2f—2f of FIGS. 2a 2b and 2c, respectively.
Figure 2E:
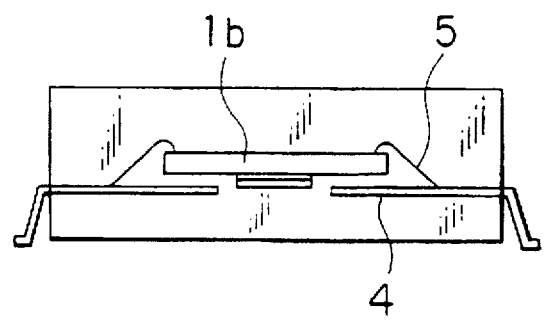
Figure 2F:
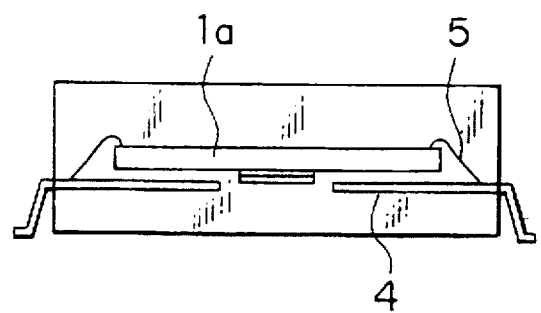

In the embodiment illustrated in FIGS. 2c and 2f, the semiconductor chip 1a of the standard size is mounted on the lead frame LF of the present invention. During manufacturing, the semiconductor chip 1a is attached by a layer of an electrically insulating bonding agent 3 and supported by the raised die pad 2. In the completed semiconductor device, the relatively small clearances between the bottom surface of the semiconductor chip 1a and the inner leads 4a, 4b and 4c are filled with the layer of the cured encapsulating resin. When necessary, the semiconductor chip 1a may be electrically connected by the bonding wires 5 to all of the first inner leads 4a, the second inner leads 4b and the third inner leads 4c. Thus, the semiconductor chip 1a is in an overlapping relationship with respect to all of the first, second and third inner leads 4a, 4b and 4c.

However, as shown in FIGS. 1a, 1b, 2b and 2e when a semiconductor chip 1b of the medium size is desired to be mounted, the semiconductor chip 1b may be electrically connected through the bonding wires 5 only to the first and the second inner leads 4b and 4c, excluding the third inner leads 4c, for establishing an electrical connection to the exterior through the leads 4. In this example, the semiconductor chip 1b is in an overlapping relationship only with respect to the first and the second inner leads 4a and 4b.

When, as shown in FIGS. 2a and 2b, a semiconductor chip 1c of the smallest size is to be mounted, only the first inner leads 4a may be electrically connected to the semiconductor chip 1 through the bonding wires 5 for the external electrical connection. In this example, the semiconductor chip 1c is in an overlapping relationship only with respect to the first inner leads 4a.

Thus, according to the present invention, even with the semiconductor chips 1, such as the semiconductor chips 1a, 1b and 1c of the different size, the same common lead frame LF can be used to mount these semiconductor chips 1a, 1b and 1c thereon and it is not necessary to significantly modify the manufacturing process and a necessary clearance for electrical insulation is maintained between the inner leads 4.

Also in this embodiment, since the plurality of the inner leads 4 are located under the semiconductor chip 1, the heat generated in the semiconductor chip 1 can be easily transmitted to the inner leads 4 through a thin layer of the encapsulating resin and then directly to outer leads 9 from which the heat is dissipated to the exterior, resulting in an improved heat dissipation.

Also, the smaller semiconductor chip 1 is connected only to the first inner leads 4a, and the number of the inner leads 4 that can be contribute to the electrical connection of the semiconductor chip 1 increases as the size of the semiconductor chip 1 increases, and at the same time, the number of the leads that contribute to conduct heat generated in the semiconductor chip 1 increases as the size of the semiconductor chip increases, resulting in a very reasonable and efficient arrangement.

Also, as seen from FIGS. 1b and 2d to 2f, a semiconductor chip 1a, 1b and 1c of different size can be mounted on the lead frame without the need for the bonding wires 5 to be arranged in the elongated loop.

Second Embodiment

Figure 3A:
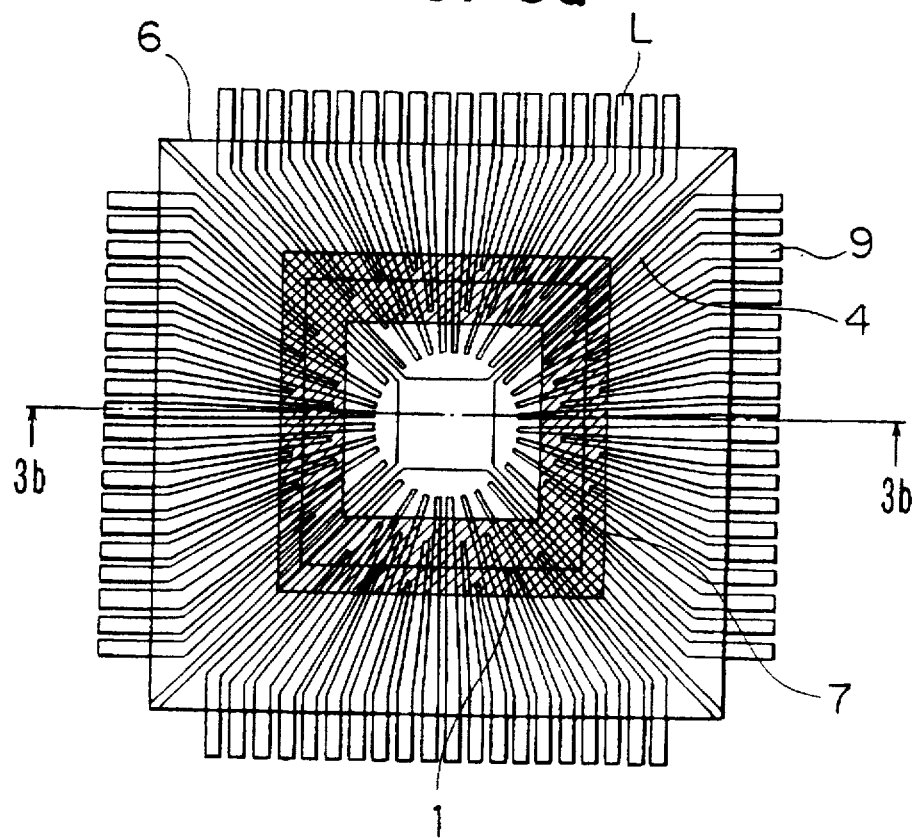
FIG. 3a is a schematic plan view of the semiconductor device of the second embodiment of the present invention.
Figure 3B:
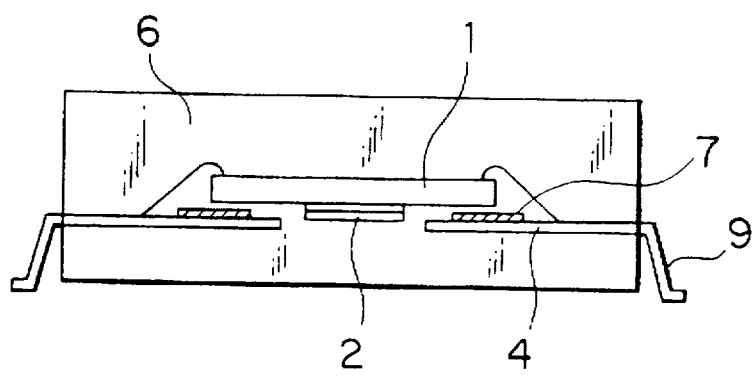

FIGS. 3a and 3b illustrate another embodiment of the semiconductor device of the present invention. FIG. 3b is a sectional view taken along line 3b—3b of FIG. 3a. In this embodiment, an electrically insulating film 7 in the shape of a picture frame is attached to the inner leads 4 in the vicinity of the peripheral portion of the bottom surface of the semiconductor chip 1, so that the electrical insulation between the bottom surface of the semiconductor chip 1 and the inner leads 4 can be made reliable. The electrically insulating film 7 may be made of any known suitable electrically insulating material. It is preferable that the insulating material have a good heat conductivity. The die pad 2 supports the semiconductor chip 1 by the unillustrated bonding agent.

Third Embodiment

Figure 4A:
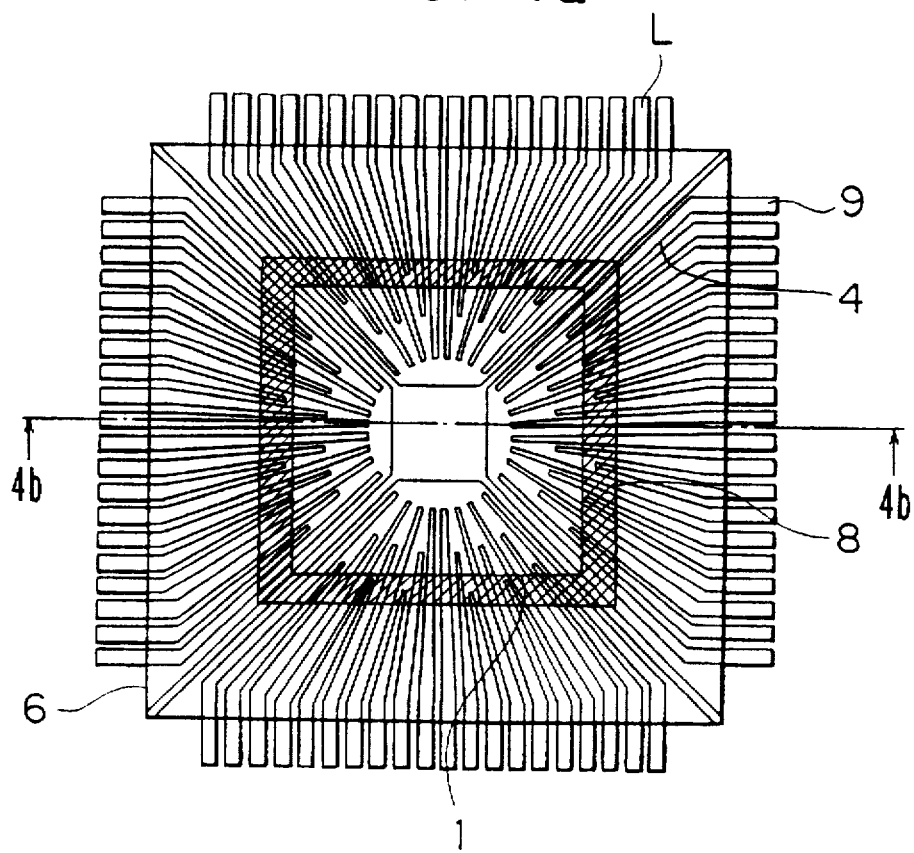
FIG. 4a is a schematic plan view of the semiconductor device of the third embodiment of the present invention.
Figure 4B:
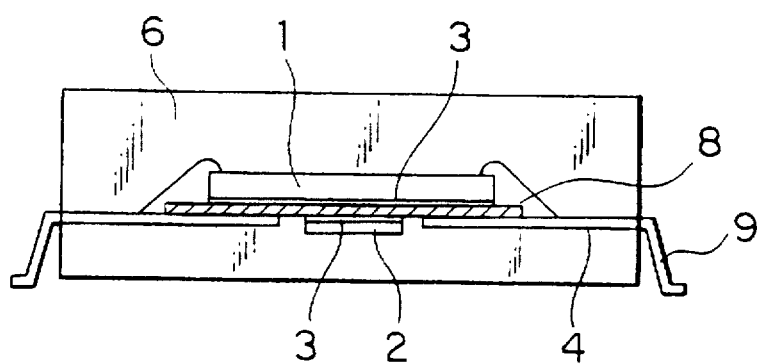

FIGS. 4a and 4b illustrate the third embodiment of the semiconductor device of the present invention. FIG. 4b is a sectional view taken along line 4b—14b of FIG. 4a. In this embodiment, a square, electrically insulating plate 8 made of an electrically insulating and shock-absorbing material having a high heat conductivity, such as a ceramic, is attached by the bonding agent 3 between the bottom surface of the semiconductor chip 1 and the die pad 2. It is seen that the electrically insulating plate 8 extends over the inner leads 4 beyond the periphery of the semiconductor chip 1. Thus, the plate is partly disposed between the semiconductor chip 1 and the inner leads 4. With this arrangement, the electrical insulation, shock-absorbing characteristic and the heat conductivity between the semiconductor chip 1 and the die pad 2 as well as the inner leads 4 are significantly improved.

Fourth Embodiment

Figure 5:
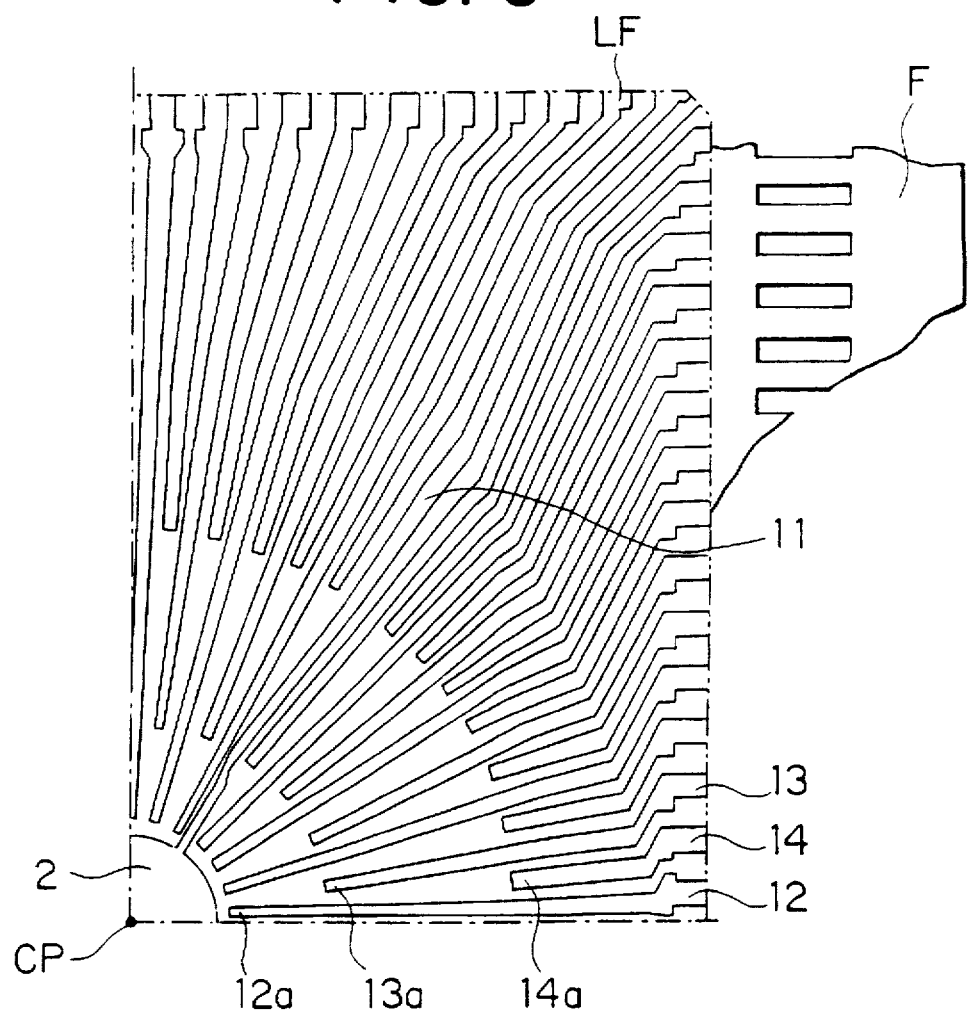
FIG. 5 is an enlarged fragmental view of the lead frame of the present invention.

FIGS. 5 illustrates one-fourth of the rectangular lead frame LF of the semiconductor device of the fourth embodiment of the present invention. In this embodiment, the lead frame LF comprises a frame F (only a small portion is shown), a die pad 2, a die pad supporting lead 11 and first, second and third of inner leads 12, 13 and 14, respectively. The supporting lead 11 as well as the inner leads 12, 13 and 14 are supported by the frame F. Each of the inner leads has different length at every one or plurality of pitches. Also, at least one of the inner leads 12, 13 or 14 substantially radially extends to a circumferential portion of the die pad 2 toward the central point CP.

In this embodiment, the die pad 2 is circular in shape and the first inner leads 12 have inner ends 12a located close to and surrounding the die pad 2. The second inner leads 13 are positioned between the first inner leads 12 and have their inner ends 13a located slightly remote from the periphery of the circular die pad 2 and concentrically surrounding the die pad 2. The third inner leads 14 are positioned between the first inner lead 12 and the second inner lead 13 and have their inner ends 14a still more remote from the die pad 2, concentrically surrounding the die pad 2. Thus, the first inner leads 12 and the second inner leads 13 are positioned in the circumferential direction of the circular die pad 2 at a position corresponding to every fifth lead or positioned at every fifth lead pitch. However, the third inner leads 14 are positioned at every other lead pitch.

In this embodiment, during manufacturing, the semiconductor chip 1c of the smallest size, such as that shown in FIG. 2a, is bonded to and supported by the die pad 2 and is electrically connected through the bonding wires 5 only to the first inner leads 12. The semiconductor chip 1b of the medium size, such as that shown in FIG. 2b, can be supported, in addition to the above-mentioned elements, also by the second inner leads 13. The semiconductor chip 1a of the largest size, such as that shown in FIG. 2c, can be supported, in addition to the first and the second inner leads 12 and 13, also by the third inner leads 14. Thus, the smaller semiconductor chip 1a is supported only by the first inner leads 12, and the number of the inner leads that contribute to the support of the semiconductor chip during manufacture increases as the size of the semiconductor chip increases, which is a very reasonable arrangement.

Fifth Embodiment

Figure 6:
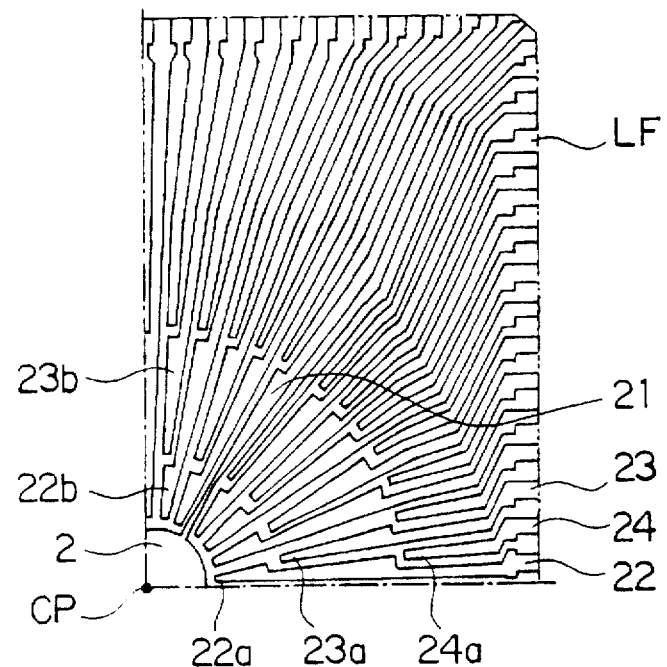
FIG. 6 is an enlarged fragmental view of another lead frame of the present invention.

FIG. 6 illustrates the fifth embodiment of the present invention in which the basic structure of the lead frame LF is similar to that shown in FIG. 5. That is, the lead frame for the semiconductor device comprises a die pad 2, a die pad supporting lead 21 and first, second and third kinds of inner leads 22, 23 and 24, respectively, each having different length at every one or plurality of pitches. Also, at least one of the inner leads 22, 23 or 24 extends toward the central point CP of the lead frame LF and to a circumferential portion of the semiconductor chip.

By comparing FIG. 6 with FIG. 5, it is seen that the first and the second inner leads 22 and 23 are provided with one or two triangular additional expanded areas 22b and 23b which fill the spaces between the radially extending neighboring inner leads. The expanded area 22b and 23b are mostly located at the inner end portion of the inner leads. Therefore, these expanded portions 22b and 23b are brought into contact with the semiconductor chip 1 and the heat conduction from the semiconductor chip 1 to the inner leads 22 and 23 is improved, resulting in an improved heat dissipation from the semiconductor device.

Sixth Embodiment

Figure 7:
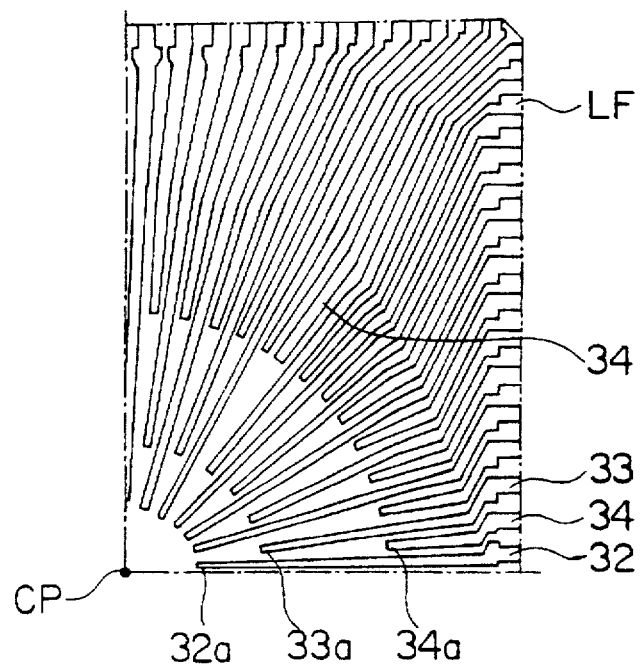
FIG. 7 is an enlarged fragmental view of a further lead frame of the present invention.

FIG. 7 illustrates the sixth embodiment of the present invention in which the basic structure of the lead frame LF for the semiconductor device is similar to that shown in FIG. 5. However, it is seen that the die pad and the die pad supporting lead are removed from the lead frame LF of this embodiment and the lead frame LF of this embodiment comprises first, second and third inner leads 32, 33 and 34, respectively, similar to those shown in FIG. 5. These inner leads 32, 33 and 34 have different lengths at every one or plurality of pitches. Also, the first inner leads 32 extend to a position corresponding to that closely surrounding the removed circular die pad. In this embodiment, the die pad supporting lead 11 shown in FIG. 5 is cut at the position corresponding to the inner ends of the third inner leads 34 to become an additional third inner lead 34.

According to this embodiment, during manufacture, the semiconductor chip 1 may be supported and electrically connected without the need for the die pad. Since no die pad is provided, the flow of the molten resin into the molding cavity is not impeded by the die pad and the supporting lead during the molding and is smooth. Also, the problem of the displacement of the die pad due to unevenly spread encapsulating resin is eliminated.

Seventh Embodiment

Figure 8:
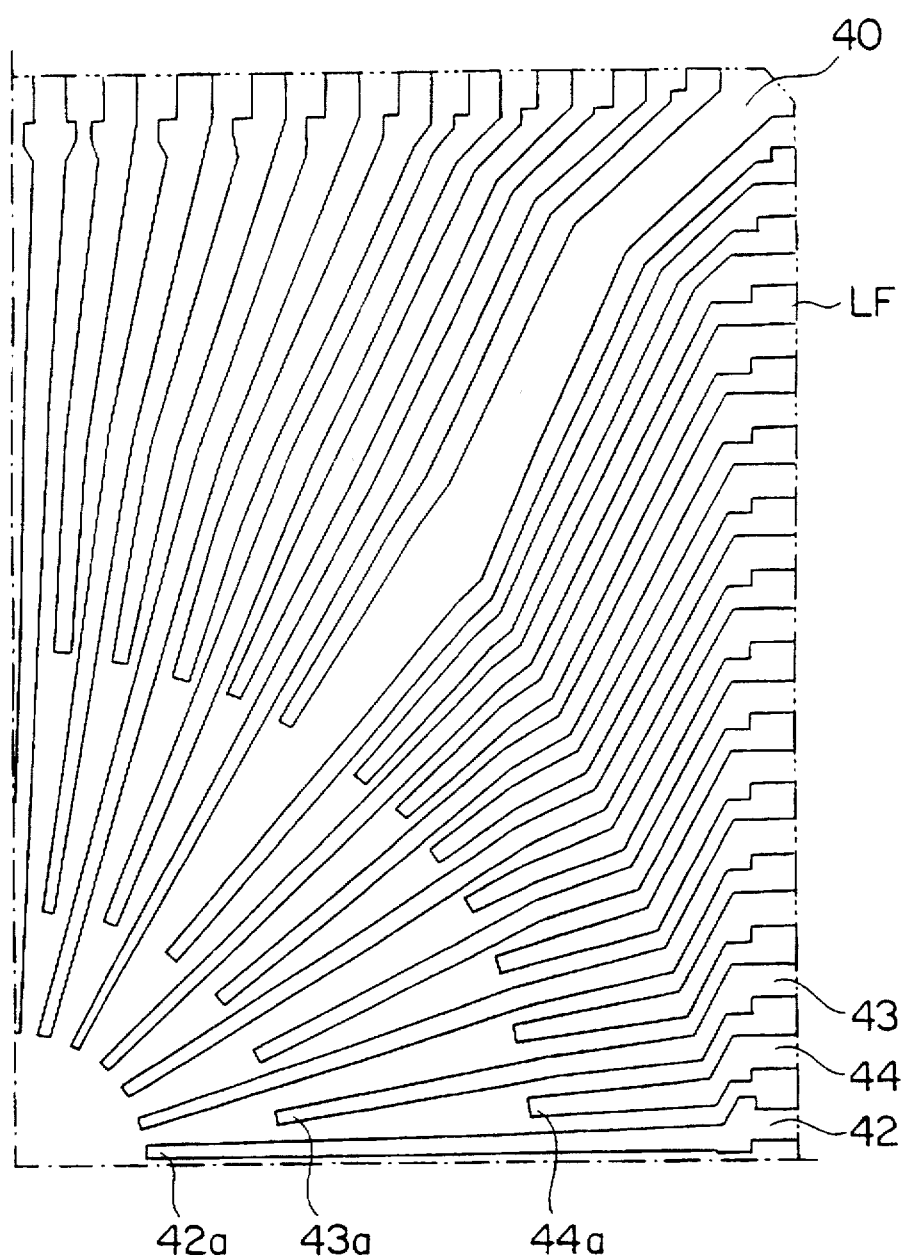
FIG. 8 is an enlarged fragmental view of a still another lead frame of the present invention.

FIG. 8 illustrates the sixth embodiment of the present invention in which the basic structure of the lead frame LF for the semiconductor device is similar to that shown in FIG. 5. However, it is seen that the die pad and the die pad supporting lead used in the embodiment shown in FIG. 5 are completely removed from the lead frame LF of this embodiment, and the lead frame LF of this embodiment comprises first, second and third inner leads 42, 43 and 44, respectively, similar to those shown in FIG. 5. These inner leads 42, 43 and 44 have different lengths at every one or plurality of pitches. Also, the first inner leads 42 extend to a position corresponding to that closely surrounding the removed circular die pad. In this embodiment, the die pad supporting lead 11 shown in FIG. 5 is completely removed from the position corresponding to the inner ends of the third inner leads 33 to define a flow path 40 for the molten resin during molding.

According to this embodiment, the semiconductor chip 1 is supported and electrically connected without the need for the die pad. Since no die pad is provided, the flow of the molten resin into the molding cavity is ensured through the flow path 40 and is not impeded by the die pad and the supporting lead during the molding and is smooth. Also, the problem of the displacement of the die pad due to the unevenly spread encapsulating resin is eliminated.

Figure 9A:
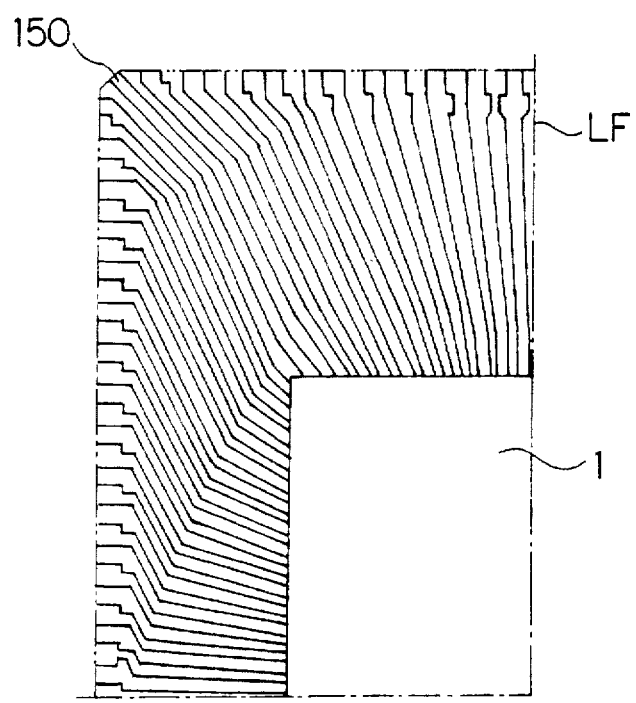
FIG. 9a is an enlarged fragmental view of another lead frame of the present invention.

FIG. 9a illustrates a semiconductor device in which a lead frame LF having die pad supporting leads 150 is used to mount a semiconductor chip 1 thereon. The lead frame LF may be one of those shown in FIGS. 5 to 7.

Figure 9B:
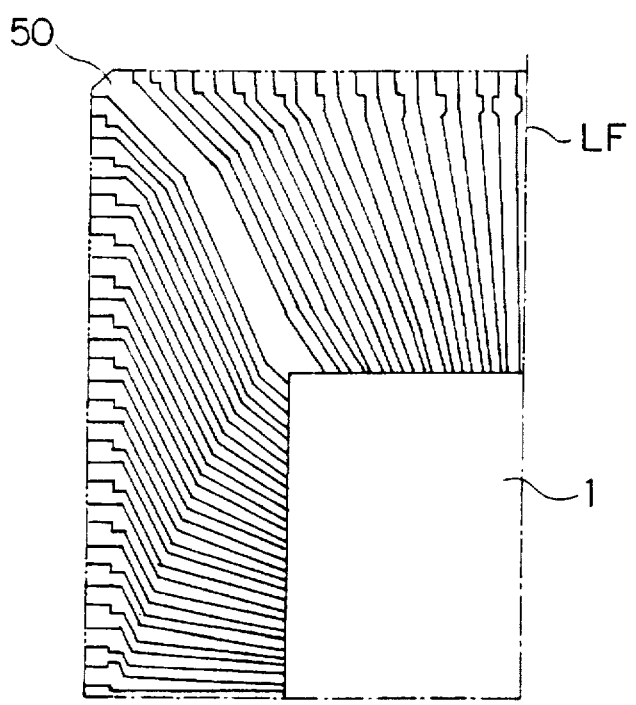
FIG. 9b is an enlarged fragmental view of a still another lead frame of the present invention.

FIG. 9b illustrates a semiconductor device in which a semiconductor chip 1 is mounted on a lead frame LF having no die pad supporting lead and a space 50 corresponding to the support pin 150 is provided. This lead frame LF may be the one shown in FIG. 8.

Figure 10A:
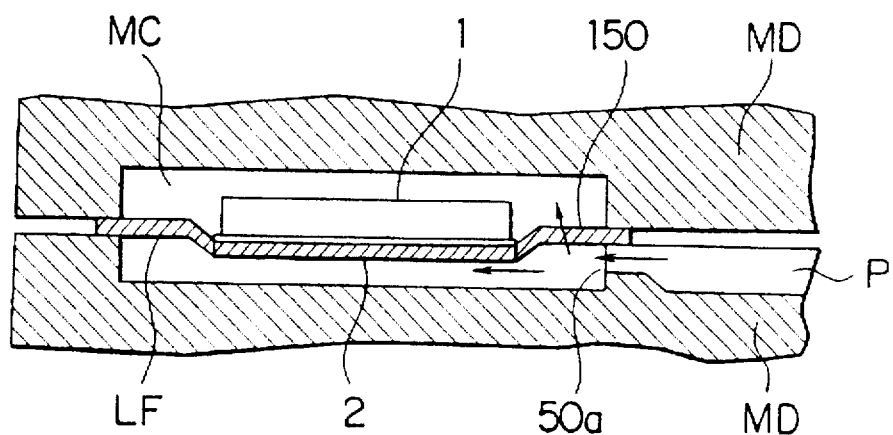
FIG. 10a is a sectional side view for illustrating the flow path of the mold resin during molding with a die pad support lead.
Figure 10B:
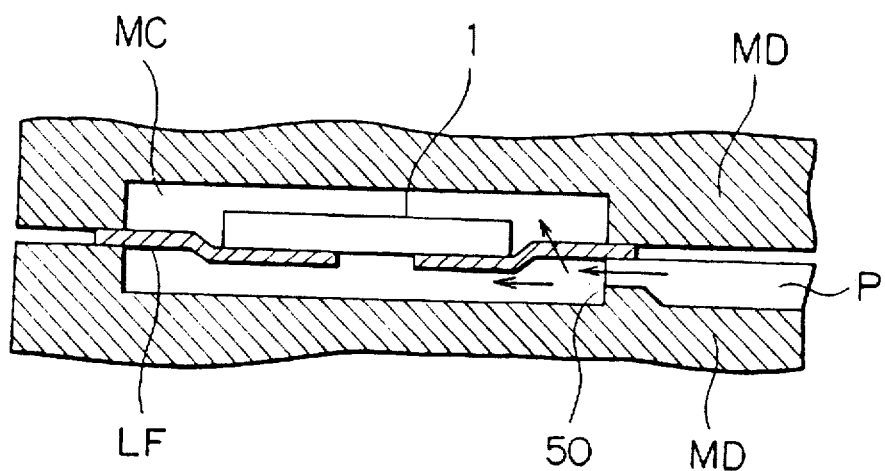
FIG. 10b is a sectional side view for illustrating the flow path of the mold resin during molding without a die pad support lead.

FIG. 10a shows by arrows the flow of the molten resin within a molding cavity MC when the lead frame LF with the die pad supporting lead and semiconductor chip 1 such as shown in FIG. 9a is mounted in the molding die MD. FIG. 10b shows by arrows the flow of the molten resin within a molding cavity MC when the lead frame LF without the die pad supporting leads and semiconductor chip 1 such as shown in FIG. 9b is mounted in the molding die.

As shown in FIG. 10a, when the lead frame LF with the supporting lead 150 (FIG. 9a) is used, the molten resin injected from the gate 50a of the molding die MD through a passage P defined under the lead frame LF flows partly into the lower space under the lead frame LF and also partly flows around the sides of the supporting lead 150 passing through narrow clearances between the leads 4 and the supporting lead 150 (see FIG. 9a) to fill the upper space above the lead frame LF. Therefore, the upward flow of the resin is somewhat impeded by the leads 4 and supporting lead 150 to make the amount of the resin introduced in the upper space smaller than that introduced into the lower space. This causes a pressure difference in the molten resin which may raise the die pad 2 together with the semiconductor chip 1 within the molding cavity MC. Since recent semiconductor device of the multi-pin package type has a very small thickness dimension which requires a small cavity height, upward shift of the die pad 2 and semiconductor chip 1 within the molding die MD may cause the bonding wires 5 to be exposed from the outer surface of the encapsulating resin 6, this of course being a fatal defect of the semiconductor device.

When no die pad and die pad supporting lead is provided in the lead frame LF as illustrated in FIGS., 9b and 10b, the flow (indicated by arrows in FIG. 10b) of the molten resin introduced through the gate 50 into the molding cavity MC is allowed to substantially freely and evenly spread into the upper and lower spaces and fills the cavity MC at uniform pressure, resulting in no displacement of the die pad 2 and the semiconductor chip 1 within the cavity MC as just above discussed and the yield of the semiconductor device is increased.

Eighth Embodiment

Figure 11:
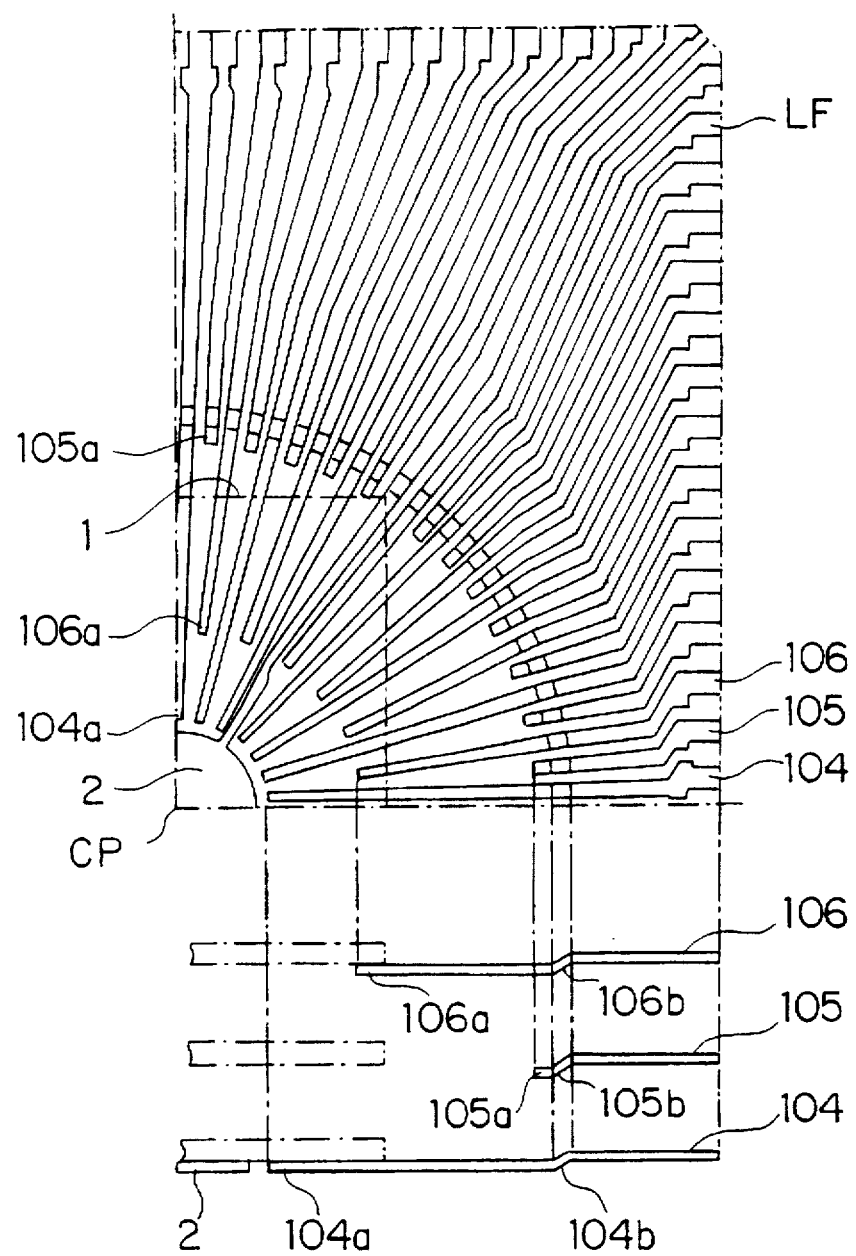
FIG. 11 is a schematic, fragmental enlarged view of the lead frame of the embodiment of the present invention with the side sections of the leads illustrated.

FIG. 11 illustrates the eighth embodiment of the lead frame LF of the semiconductor device of the present invention. The lead frame LF of this embodiment has a structure basically similar to that of the lead frame LF shown in FIG. 5. The structure of this embodiment is different from that shown in FIG. 5 in that its inner leads 104, 105, 106 all have slightly cranked portions 104b, 105b and 106b or are bent twice at right angles in opposite direction at a position spaced away from the die pad 1 or from the central point CP by an equal distance so that the end portions 104a, 105a, and 106a at different radial positions together with the die pad 2 are lowered from the plane of the lead frame LF. In other words, the die pad 2 and the surrounding portions of the inner leads 104 to 106 are counter-sunk. The shallow cranking of the inner leads 104 to 106 is best seen from the side views of the inner leads 104 to 106 provided below the plan view of the lead frame LF in FIG. 11. This counter sink is for the purpose of placing the outer leads 9 close to the central plane of the semiconductor chip 1. The depth of the counter-sunk may preferably be equal to one half of the thickness of the semiconductor chip 1 so that the semiconductor chip 1 may be centrally positioned in the thickness direction within the encapsulating resin 6 even when a symmetrical molding die MD is used.

Ninth Embodiment

Figure 12:
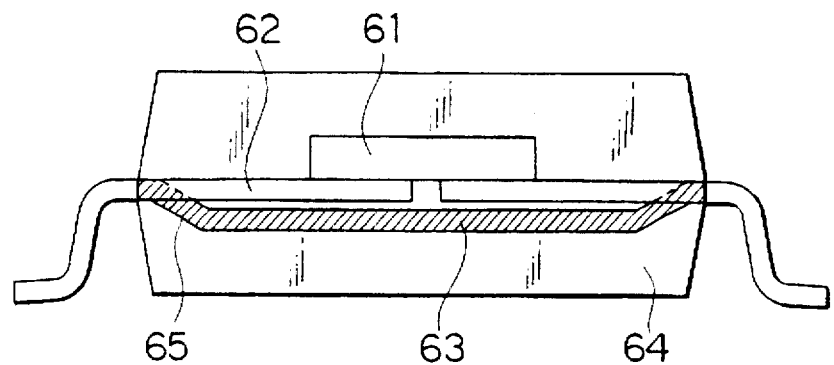
FIG. 12 is a schematic side view of the semiconductor device of another embodiment of the present invention.

FIG. 12 illustrates the ninth embodiment of the semiconductor device of the present invention in which the illustrated QFP type semiconductor device comprises a semiconductor chip 61, a lead frame 62 made of 42 alloy (Trade name) having a plurality of straight inner leads of various lengths, a heat spreader 63 made of copper, for example, and a mold resin 64 encapsulating the semiconductor chip 61 mounted on the lead frame 62. In this embodiment, the semiconductor chip 61 is supported by the inner end portions of the inner leads of the lead frame 62 which has a structure similar to those shown in FIGS. 7 and 8 in which no die pad is provided. It is seen that the heat spreader 63 in the shape of a plate is embedded within the encapsulating resin 64 below the lead frame 62 in order to further improve the heat dissipation of the semiconductor device. The heat dissipation is already significantly improved by the structure of the present invention in which the semiconductor chip 61 is provided with a number of heat conducting paths through the plurality of inner leads. The heat spreader 63 may be any well-known type and may be supported at its four corners by a support lead 65 which suspends the heat spreader 63 from the same level as the lead frame 62.

Tenth Embodiment

Figure 13:
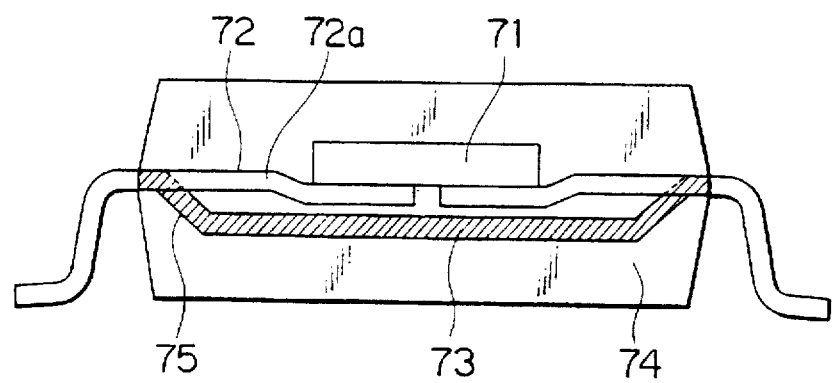
FIG. 13 is a schematic side view of the semiconductor device of further embodiment of the present invention.

FIG. 13 illustrates the tenth embodiment of the semiconductor device of the present invention in which the illustrated QFP type semiconductor device comprises a semiconductor chip 71, a lead frame 72 such as 42 alloy (Trade name) having a plurality of cranked inner leads of various lengths, a heat spreader 73 made of copper and a mold resin 74 encapsulating the semiconductor chip 71 and the lead frame 73. In this embodiment, the semiconductor chip 71 is supported by the inner end portions of the inner leads of the lead frame 72 which has a structure similar to that shown in FIG. 11 in which no die pad is provided and the inner ends of the inner leads are cranked at 72a to define a counter sink around the semiconductor chip 71. It is seen that the heat spreader 73 with support pins 75 is embedded within the encapsulating resin 74 in order to further improve the heat dissipation of the semiconductor device which is already significantly improved by the structure of the present invention in which the semiconductor chip 71 is provided with a number of heat conducting paths through the plurality of inner leads.

Eleventh Embodiment

Figure 14:
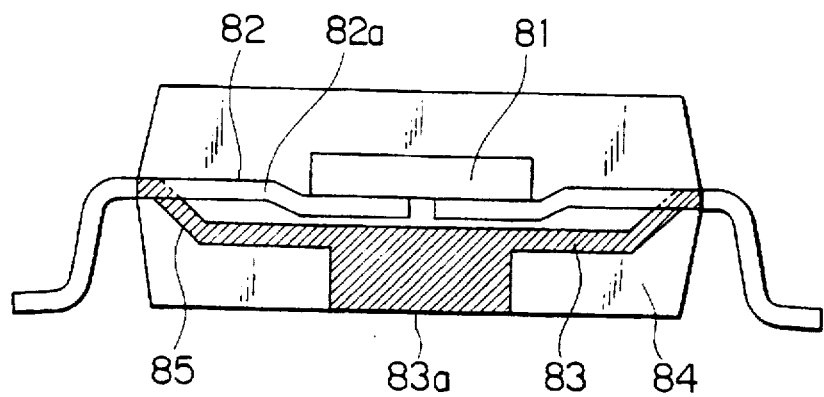
FIG. 14 is a schematic side view of the semiconductor device of a still another embodiment of the present invention.
Figure 15A:
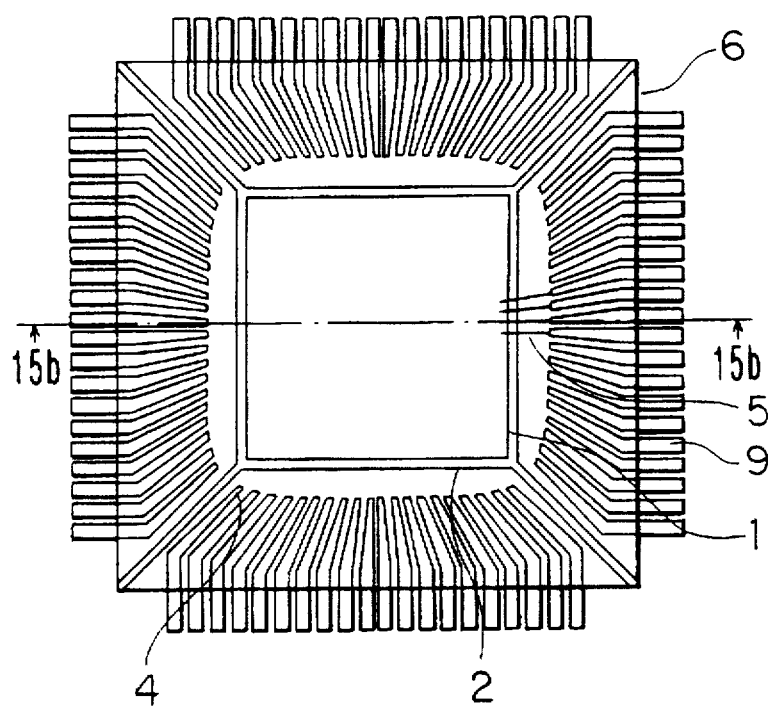
FIG. 15a is a schematic plan view of the semiconductor device of a conventional design.
Figure 15B:
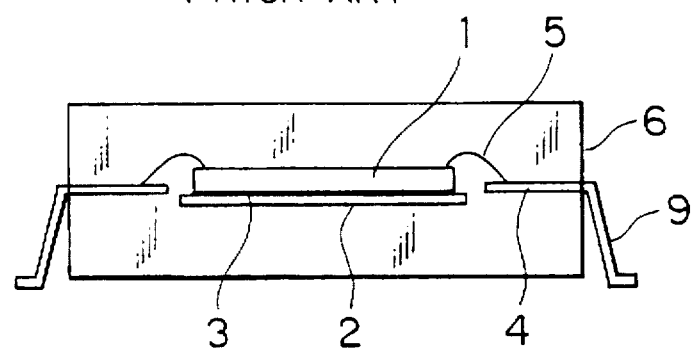
Figure 16:
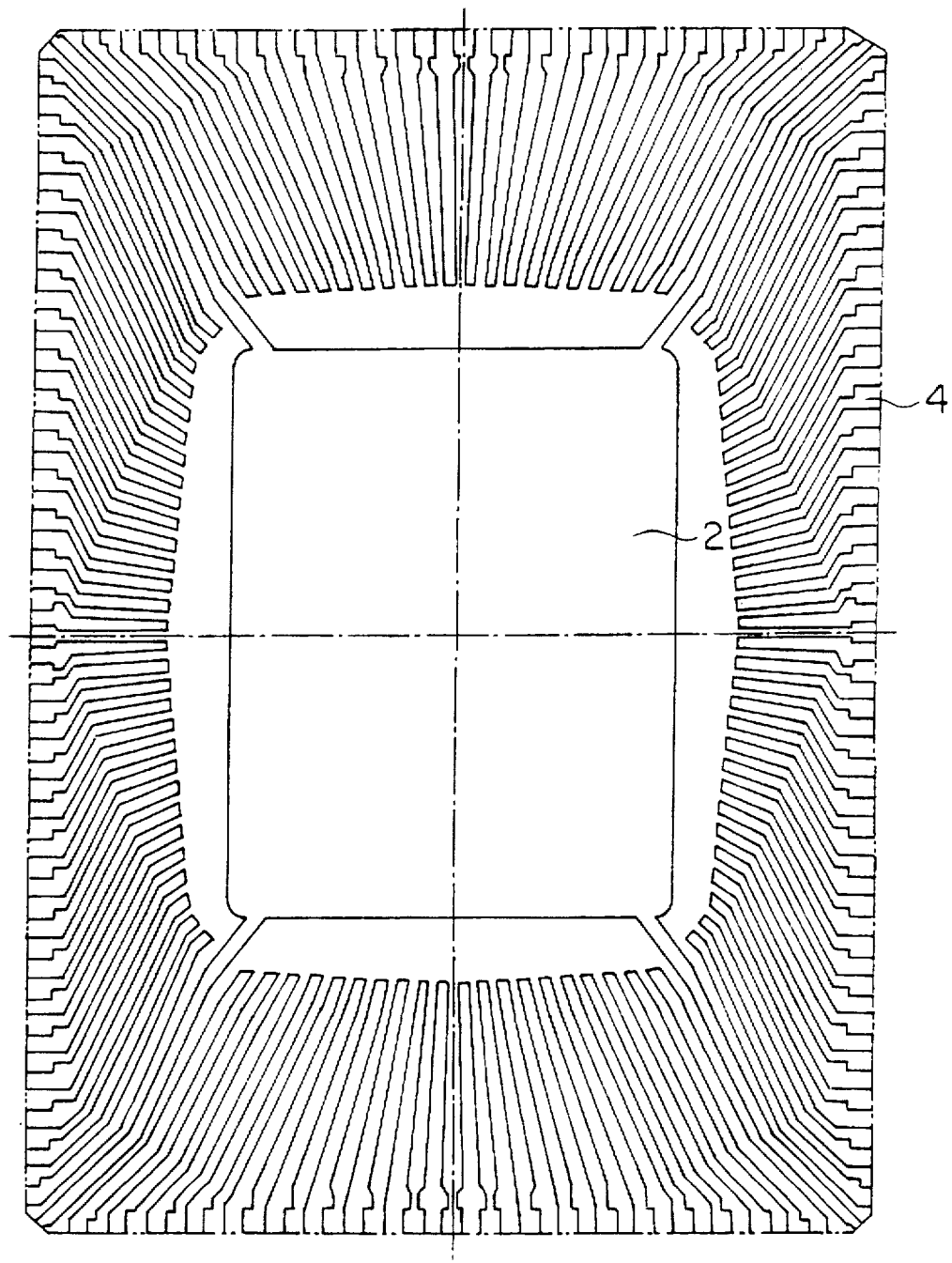
FIG. 16 is a plan view of a conventional lead frame.
Figure 17:
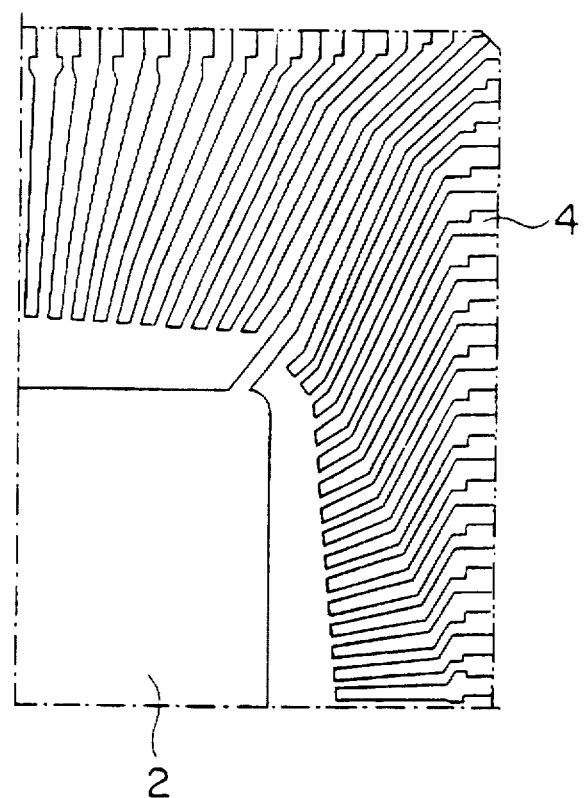
FIG. 17 is a fragmental view of the conventional lead frame shown in FIG. 16.

FIG. 14 illustrates the tenth embodiment of the semiconductor device of the present invention in which the illustrated QFP type semiconductor device comprises a semiconductor chip 81, a lead frame 82 such as 42 alloy (Trade name) having a plurality of cranked inner leads of various lengths, a heat spreader 83 made of copper and a mold resin 84 encapsulating the semiconductor chip 81 and the lead frame 83. In this embodiment, the semiconductor chip 81 is supported by the inner end portions of the inner leads of the lead frame 82 which has a structure similar to that shown in FIG. 11 in which no die pad is provided and the inner ends of the inner leads are cranked at 82a to define a counter sink around the semiconductor chip 81. A heat spreader 83 supported by support leads 85 is embedded within the encapsulating resin 84 below the lead frame 82 in order to further improve the heat dissipation of the semiconductor device. The heat dissipation which is already significantly improved by the structure of the present invention in which the semiconductor chip 81 is provided with a large number of heat conducting paths through the inner leads extending deep bellow the semiconductor chip 81. In this embodiment, the heat spreader 83, has a heat block 83a one surface of which is exposed to the exterior from the bottom surface of the encapsulating resin 84, whereby the heat dissipation of the semiconductor device is further improved.

As has been described, the semiconductor device of the present invention comprises a semiconductor chip, a plurality of leads including first inner leads and second inner leads substantially radially extending from a central point of the semiconductor chip, electrical conductors electrically connecting the semiconductor chip to the inner lead and an encapsulating resin for encapsulating the semiconductor chip, the electrical conductors and the inner leads. Each of the first inner leads has a first inner end located in the vicinity of the central point, and each of the second inner leads has a second inner end located remoter than the first inner end from the central point; and the first and second inner leads are substantially alternatively arranged. Thus, the arrangement is such that at least some of the inner leads extend under the semiconductor chip providing heat conducting paths. Accordingly, the semiconductor device in which any semiconductor chip of various different shapes and sizes may be mounted on the same, common lead frame without the need for substantial change in the assembly technique and in which the heat dissipation is improved. Also, the lead frame of the present invention is particularly useful for the manufacture of the semiconductor device and capable of manufacturing by the punching process which is less expensive than the etching process.

The lead frame of the present invention comprises a frame, and a plurality of leads supported by the frame and including first inner leads and second inner leads radially extending substantially toward a central point of the frame. Each of the first inner leads has a first inner end located in the vicinity of the central point, each of the second inner leads has a second inner end located remoter than the first inner end from the central point, and the first and second inner leads are substantially alternatively disposed, whereby the lead frame is made applicable in common to mount thereon semiconductor chips of different outer dimensions and a necessary clearance is maintained between the leads.

What is claimed is:

1. A semiconductor device comprising:

a semiconductor chip;

a plurality of leads including first inner leads and second inner leads extending substantially radially from a central point of said semiconductor chip;

electrical conductors electrically connecting said semiconductor chip to at least one of said first and second inner leads; and an encapsulating resin encapsulating said semiconductor chip, said electrical conductors, and said first and second inner leads, said first inner leads each having a first inner end located proximate said central point, said second inner leads each having a second inner end located farther than said first inner ends from said central point, said first and second inner leads being substantially alternatingly arranged wherein said semiconductor chip overlaps only said first inner leads, thereby providing heat conducting paths.

2. A semiconductor device comprising:

a semiconductor chip;

a plurality of leads including first inner leads, second inner leads, and third inner leads extending substantially radially from a central point of said semiconductor chip;

electrical conductors electrically connecting said semiconductor chip to at least one of said first, second, and third inner leads; and an encapsulating resin encapsulating said semiconductor chip, said electrical conductors, and said first, second, and third inner leads, said first inner leads each having a first inner end located proximate said central point, said second inner leads each having a second inner end located farther than said first inner ends from said central point, said third inner leads each having a third inner end located farther than said second inner ends from said central point, wherein said semiconductor chip overlaps only said first and second inner leads, thereby providing heat conducting paths.

3. A semiconductor device comprising:

a semiconductor chip;

a plurality of leads including first inner leads and second inner leads extending substantially radially from a central point of said semiconductor chip;

electrical conductors electrically connecting said semiconductor chip to at least one of said first and second inner leads;

an encapsulating resin encapsulating said semiconductor chip, said electrical conductors, and said first and second inner leads, said first inner leads each having a first inner end located proximate said central point, said second inner leads each having a second inner end located farther than said first inner ends from said central point, said first and second inner leads being substantially alternatingly arranged wherein said semiconductor chip overlaps at least some of said first and second inner leads, thereby providing heat conducting paths; and an electrically insulating thermal conductor having a frame shape with inner and outer peripheries, the outer periphery being larger than an outer periphery of said semiconductor chip, said thermal conductor being disposed within said encapsulating resin between said semiconductor chip and said first inner leads.

* * * * *